(12) United States Patent
Shur et al.

(10) Patent No.: US 7,848,379 B2
(45) Date of Patent: Dec. 7, 2010

(54) LED-BASED OPTICAL PUMPING FOR LASER LIGHT GENERATION

(75) Inventors: Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 439 days.

(21) Appl. No.: 11/625,925

(22) Filed: Jan. 23, 2007

(65) Prior Publication Data

US 2007/0171953 A1    Jul. 26, 2007

Related U.S. Application Data

(60) Provisional application No. 60/761,954, filed on Jan. 25, 2006.

(51) Int. Cl.
*H01S 3/091* (2006.01)
(52) U.S. Cl. .......................... 372/70; 372/75
(58) Field of Classification Search .............. None
See application file for complete search history.

(56) References Cited

U.S. PATENT DOCUMENTS

| | | | |
|---|---|---|---|
| 3,949,320 A | | 4/1976 | Castleberry et al. |
| 4,794,615 A | | 12/1988 | Berger et al. |
| 5,216,688 A | * | 6/1993 | Kortz et al. .................. 372/75 |
| 5,454,002 A | * | 9/1995 | McCann ...................... 372/36 |
| 5,463,649 A | * | 10/1995 | Ashby et al. ................. 372/40 |
| 5,530,711 A | * | 6/1996 | Scheps ........................ 372/20 |
| 5,748,654 A | * | 5/1998 | Marabella et al. .......... 372/19 |
| 5,783,844 A | * | 7/1998 | Kobayashi et al. ......... 257/103 |
| 5,796,771 A | * | 8/1998 | DenBaars et al. .......... 372/75 |
| 5,840,217 A | | 11/1998 | Lupo et al. |
| 6,327,288 B1 | | 12/2001 | Wang et al. |
| 6,580,741 B2 | | 6/2003 | Jiang et al. |
| 6,665,329 B1 | | 12/2003 | Crawford et al. |
| 6,807,211 B1 | | 10/2004 | Cok et al. |
| 6,891,187 B2 | | 5/2005 | Cho et al. |

(Continued)

FOREIGN PATENT DOCUMENTS

JP     02122581 A * 5/1990

OTHER PUBLICATIONS

Shur et al., "Basic Device Issues in UV Solid-State Light Emitters and Detectors," UV Solid-State Light Emitters and Detectors, NATO Science Series, II Mathematics, Physics and Chemistry, vol. 144, Kluwer Academic Publishers, 2004, pp. 1-13.
Zhang et al., "AlGaN Deep-Ultraviolet Light-Emitting Diodes," Japanese Journal of Applied Physics, vol. 44, No. 10, 2005, pp. 7250-7253.
Schneider et al., "An Ultraviolet Organic Thin-Film Solid-State Laser for Biomarker Applications," Advanced Materials, 17, No. 1, Wiley-VCH Verlag GmbH & Co. KGaA, Weinheim, Jan. 6, 2005, pp. 31-34.

(Continued)

*Primary Examiner*—Minsun Harvey
*Assistant Examiner*—Sean Hagan
(74) *Attorney, Agent, or Firm*—John W. LaBatt; Hoffman Warnick LLC (57) ABSTRACT

Laser light generating solutions are provided that use one or more light emitting diodes to optically pump a laser light generating structure. The laser light generating structure can include organic or inorganic laser material. The light emitting diodes can be located on the same substrate as the laser light generating structure or on a separate substrate that is connected to the substrate with the laser light generating structure. Various other features can be included to enhance the optical pumping and/or enable electrical pumping of the active structure when it includes an inorganic laser material.

31 Claims, 10 Drawing Sheets

U.S. PATENT DOCUMENTS

| | | |
|---|---|---|
| 6,943,377 B2 | 9/2005 | Gaska et al. |
| 2002/0001328 A1* | 1/2002 | Albrecht et al. .............. 372/75 |
| 2003/0009205 A1* | 1/2003 | Biel ............................ 607/88 |
| 2004/0101008 A1* | 5/2004 | Kurtz et al. .................. 372/39 |

OTHER PUBLICATIONS

International Search Report with written opinion for companion PCT Application dated Feb. 14, 2008.

* cited by examiner

LED-BASED OPTICAL PUMPING FOR LASER LIGHT GENERATION

REFERENCE TO PRIOR APPLICATION

The current application claims the benefit of co-pending U.S. Provisional Application No. 60/761,954, entitled "Monolithic Light Emitter", which was filed on 25 Jan. 2006, and which is hereby incorporated herein by reference.

FIELD OF THE INVENTION

Aspects of the invention relate generally to laser light generating devices, and more particularly, to an improved laser light generating device that optically pumps a laser light generating structure using a set of light emitting diodes located on a substrate.

BACKGROUND OF THE INVENTION

Recently, a great deal of interest is focused on nitride-based light emitting diodes (LEDs) and lasers that emit light in the blue and deep ultraviolet (UV) wavelengths. These light emitting devices may be capable of being incorporated into various applications, including solid-state lighting, biochemical detection, high-density data storage, and the like. However, to date, the performance of nitride-based light emitting diodes and lasers quickly worsens as the radiation wavelength is reduced into the ultraviolet range.

A difficulty in developing a deep UV LED is a deficient hole injection. In particular, Magnesium (Mg) is the most successful acceptor, and is therefore commonly used for p-type Gallium (Ga) Nitride (N) layers. The room-temperature activation energy for such a layer can be as high as two-hundred fifty milli-electron Volts (meV), and increases roughly linearly with the Aluminum (Al) molar fraction in AlGaN alloys. However, a large acceptor binding energy results in a deficient hole injection. This is particularly true for a deeper UV LED, in which a higher Al molar fraction is required.

Regardless, deep UV LEDs and UV LED lamps have recently been developed that provide a dramatic improvement of output power and efficiency over previous deep UV devices and lamps, and may provide for a large UV power density. However, standard UV laser diodes remain difficult and expensive to manufacture, and deep UV lasing has not been achieved.

Laser structures have been manufactured using inorganic and/or organic laser structures. For example, an illustrative laser structure may include Aluminum-Gallium-Indium-Nitride (AlGaInN)-based solid state LEDs that pump an active media. The active media can be an inorganic structure, such as an AlGaInN or AlGaN (with or without traces of In)-based quantum well, quantum wire, or quantum dot laser structure or may be an organic structure. Organic LEDs have demonstrated long life times and high brightness, and as a result, have been utilized in some commercial applications. Amplified spontaneous emission has been observed in, for example, spiro-linked materials, including Spiro-44, shown and described in U.S. Pat. No. 5,840,217. However, the reported wavelengths for an optically pumped organic laser have been 377 nanometers or longer, barely within the UVA subregion of the UV spectral region. To date, electrically pumped organic lasing has not been demonstrated.

In view of the foregoing, a need exists to overcome one or more deficiencies in the related art.

BRIEF SUMMARY OF THE INVENTION

Aspects of the invention provide laser light generating solutions that use one or more light emitting diodes to optically pump a laser light generating structure. The laser light generating structure can include organic or inorganic laser material. The light emitting diodes can be located on the same substrate as the laser light generating structure or on a separate substrate that is connected to the substrate with the laser light generating structure. Various other features can be included to enhance the optical pumping and/or enable electrical pumping of the active structure when it includes an inorganic laser material.

A first aspect of the invention provides a laser light generating heterostructure comprising: a substrate; a laser light generating structure located on the substrate; and a set of light emitting diodes located on the substrate, the set of light emitting diodes being configured to optically pump the laser light generating structure.

A second aspect of the invention provides a laser light generating device comprising: a substrate; a laser light generating structure; a plurality of light emitting diodes located on the substrate, the plurality of light emitting diodes being configured to optically pump the laser light generating structure.

A third aspect of the invention provides a method of generating laser light, the method comprising: obtaining a laser light generating device including: a substrate; a laser light generating structure located on the substrate; and a set of light emitting diodes located on the substrate; and optically pumping the laser light generating structure with light emitted from the set of light emitting diodes.

A fourth aspect of the invention provides a method of manufacturing a laser light generating device, the method comprising: obtaining a substrate; applying a laser light generating structure on the substrate; and applying a set of light emitting diodes on the substrate, the set of light emitting diodes being configured to optically pump the laser light generating structure.

The illustrative aspects of the invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide laser light generating solutions that use one or more light emitting diodes to optically pump a laser light generating structure. The laser light generating structure can include organic or inorganic laser material. The light emitting diodes can be located on the same substrate as the laser light generating structure or on a separate substrate that is connected to the substrate with the laser light generating structure. Various other features can be included to enhance the optical pumping and/or enable electrical pumping of the active structure when it includes an inorganic laser material.

As used herein, unless otherwise noted, the term "set" means one or more (i.e., at least one) and the phrase "any solution" means any now known or later developed solution. Additionally, as used herein, the term "applying" is inclusive of any solution for growing, depositing, forming, fixing, or the like, one element of a heterostructure or device to another element of the heterostructure or device. Still further, as used herein, the term "light" means any electromagnetic radiation, and may include wavelengths in visible and/or non-visible spectra.

Figure 1:
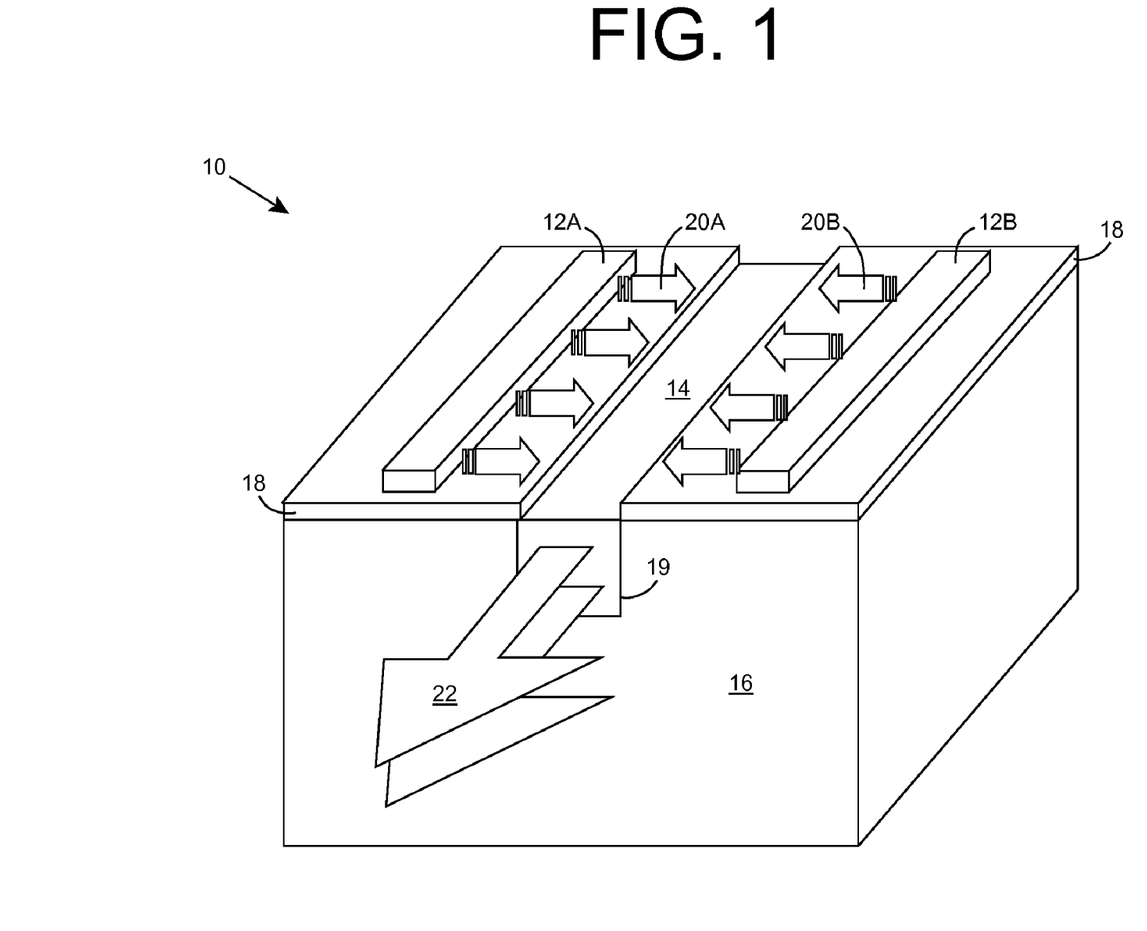
FIG. 1 shows an illustrative laser light generating heterostructure according to an embodiment of the invention.

Turning to the drawings, FIG. 1 shows an illustrative laser light generating heterostructure 10 according to an embodiment of the invention. Heterostructure 10 includes a set of light emitting diodes (LEDs) 12A-B and an active medium 14. In general, LEDs 12A-B are configured to emit light 20A-B that optically pumps active medium 14, which in turn generates laser light 22. Each LED 12A-B can comprise any type of LED now known or later developed. Similarly, active medium 14 can comprise any type of organic or inorganic laser light generating structure now known or later developed. In an embodiment of the invention, LEDs 12A-B emit light 20A-B having a wavelength in the ultraviolet (UV) spectral region and active medium 14 generates laser (e.g., coherent) light 22 having a wavelength in the UV spectral region.

An aspect of the invention provides a monolithically integrated laser light generating heterostructure 10. To this extent, heterostructure 10 is shown including a substrate 16 on which LEDs 12A-B and active medium 14 are located. LEDs 12A-B and active medium 14 can be applied to substrate 16 using any solution. For example, a trench 19 can be applied in substrate 16 using any solution, and active medium 14 can be applied therein. Further, an epitaxial structure 18 (including one or more epitaxial layers) can be applied directly on substrate 16 and LEDs 12A-B can be applied directly thereto. Epitaxial structure 18 can include any set of layers for locating LEDs 12A-B on substrate 16.

In an embodiment of the invention, heterostructure 10 comprises a nitride-based heterostructure. To this extent, LED(s) 12A-B can comprise nitride-based LED(s), such as nitride-based UV LED(s). Additionally, the nitride-based LED can include group-III nitride materials, in which one or more active and/or passive layers comprise a group-III nitride composition, such as $Al_xGa_yIn_zN$, where $0 \leq X, Y, Z \leq 1$, and $X+Y+Z=1$. Regardless, each LED 12A-B can include any type of heterostructure for generating light having one or more desired characteristics. To this extent, an LED 12A-B can include a graded barrier layer/quantum well composition to provide for improved light emission. Further, an LED 12A-B can comprise a super luminescent LED. The UV light emitted by an LED 12A-B can have a wavelength as small as approximately 200 nanometers.

As noted herein, active medium 14 can comprise any type of organic and/or inorganic material. For example, active medium 14 can comprise a multiple quantum well laser structure, a quantum wire laser structure, a quantum dot laser structure, or the like. In an embodiment of the invention, active medium 14 comprises a group-III nitride composition, such as $Al_xGa_yIn_zN$, where $0 \leq X, Y, Z \leq 1$, and $X+Y+Z=1$, e.g., AlGaInN, AlGaN with our without traces of In, and/or the like. Additionally, active medium 14 can comprise any type of organic laser structure now known or later developed, such as a spiro-linked material, e.g., Spiro-44, or the like.

The materials for substrate 16 and/or epitaxial structure 18 can be selected based on the materials for LED(s) 12A-B and/or active medium 14 using any solution. In an embodiment of the invention, substrate 16 comprises a sapphire substrate and epitaxial structure 18 comprises a nitride-based structure. However, substrate 16 can comprise any type of substrate, such as silicon carbide, silicon, AlN, GaN, AlGaN, AlON, $LiGaO_2$, and/or the like, on which LEDs 12A-B are applied.

In any event, the materials and/or configurations of substrate 16 and/or epitaxial structure 18 can be selected to provide one or more operational characteristics for heterostructure 10. For example, epitaxial structure 18 can include electrical contacts that enable the operation of LEDs 12A-B. In this case, the electrical contacts can enable LEDs 12A-B to be operated independently and/or as a group/sub-group.

Additionally, epitaxial structure 18 and/or substrate 16 can be configured to direct light emitted from LEDs 12A-B and/or active medium 14. In particular, epitaxial structure 18 and/or substrate 16 can include materials and/or wave guiding structure(s) that assist in directing light emitted from LEDs 12A-B and/or active medium 14. For example, substrate 16 can comprise a material that is transparent or substantially transparent for light emitted by LEDs 12A-B and/or active medium 14. Substrate 16 and/or epitaxial structure 18 can be transparent across a wide spectrum or for a particular spectrum. To this extent, when LEDs 12A-B and/or active medium 14 emit UV light, substrate 16 and/or epitaxial structure 18 can comprise a material that is transparent only for deep UV light, such as sapphire or $LiGaO_2$, which in turn can be emitted out of heterostructure 10 through substrate 16 and/or epitaxial structure 18. In particular, substrate 16 can be transparent, enabling laser light 22 to be emitted from heterostructure 10 through substrate 16.

Further, one or more wave guiding structures can be monolithically integrated in heterostructure 10. For example, one or more layers in epitaxial structure 18 and/or substrate 16 can include a set of holes configured to deliver pumping light 20A-B from LEDs 12A-B to active medium 14. To this extent, substrate 16 can comprise anodized aluminum having a periodic array of holes that form a photonic crystal. The photonic crystal can provide guidance and/or a reflective surface for pumping light 20A-B and/or laser light 22. Additionally, one or more holes in substrate 16 can be filled with a light emitting structure, such as an organic laser material (e.g., Spiro-44), a semiconductor laser structure, and/or the like. Epitaxial structure 18 also can include a set of holes that are aligned with the holes in substrate 16 to provide guidance of pumping light 20A-B through some or all of epitaxial structure 18. To this extent, one or more holes in epitaxial structure 18 and/or substrate 16 can be filled with a material having a different refractive index, such as silicone, than the surrounding material in epitaxial structure 18 and/or substrate 16.

Figure 2:
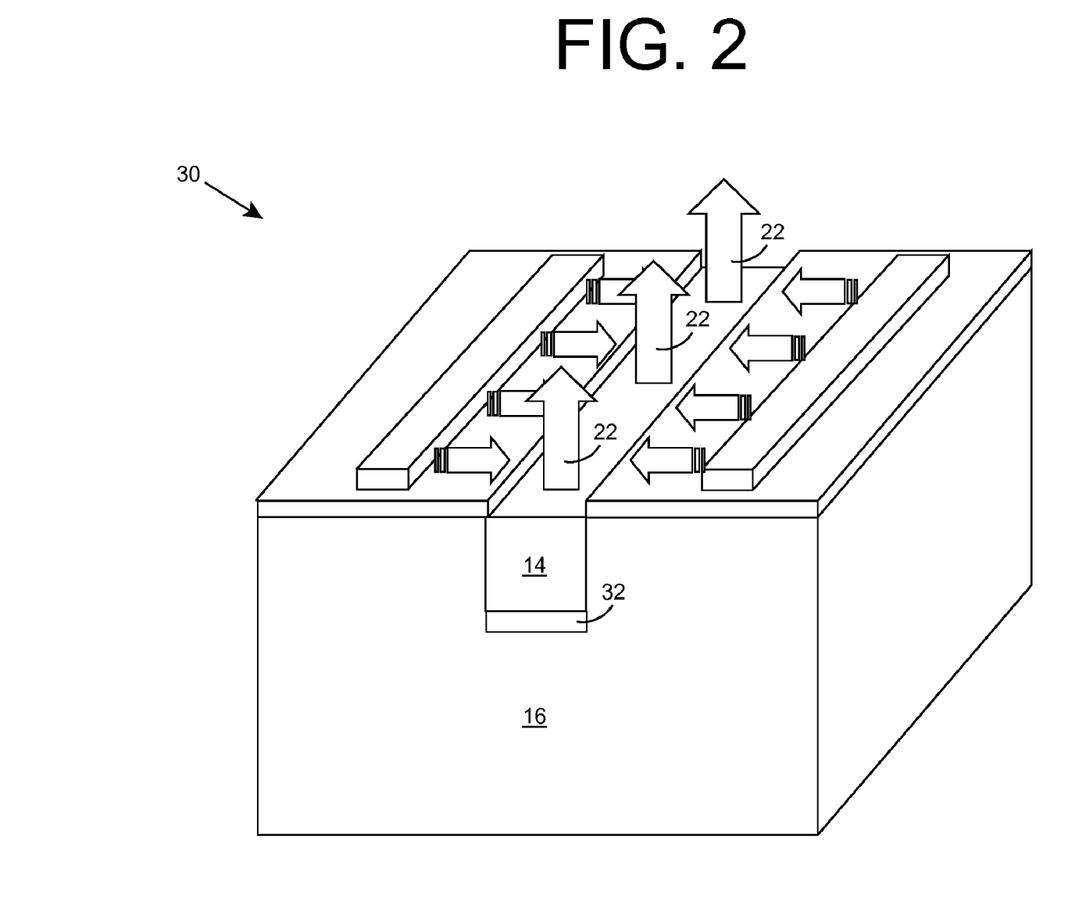
FIG. 2 shows another illustrative laser light generating heterostructure according to an embodiment of the invention.

Heterostructure 10 can further include one or more additional layers/structures for providing wave guidance and/or reflective surface(s) to enhance the emission of laser light 22. For example, FIG. 2 shows another illustrative laser light generating heterostructure 30 according to an embodiment of the invention. Heterostructure 30 includes an active medium 14 that emits laser light 22 from a top surface. To this extent, heterostructure 30 includes a reflective structure 32 disposed between active medium 14 and substrate 16 to enhance the emission of laser light 22 from the top surface. Reflective structure 32 can comprise any type of structure (e.g., one or more layers) that reflects laser light 22. For example, reflective structure 32 can comprise a distributed Bragg reflector (DBR) structure. In this case, reflective structure 32 can be doped p-type to further enhance the emission of laser light 22 by active medium 14. Further, reflective structure 32 can comprise a V-groove mirror or the like.

Figure 3A:
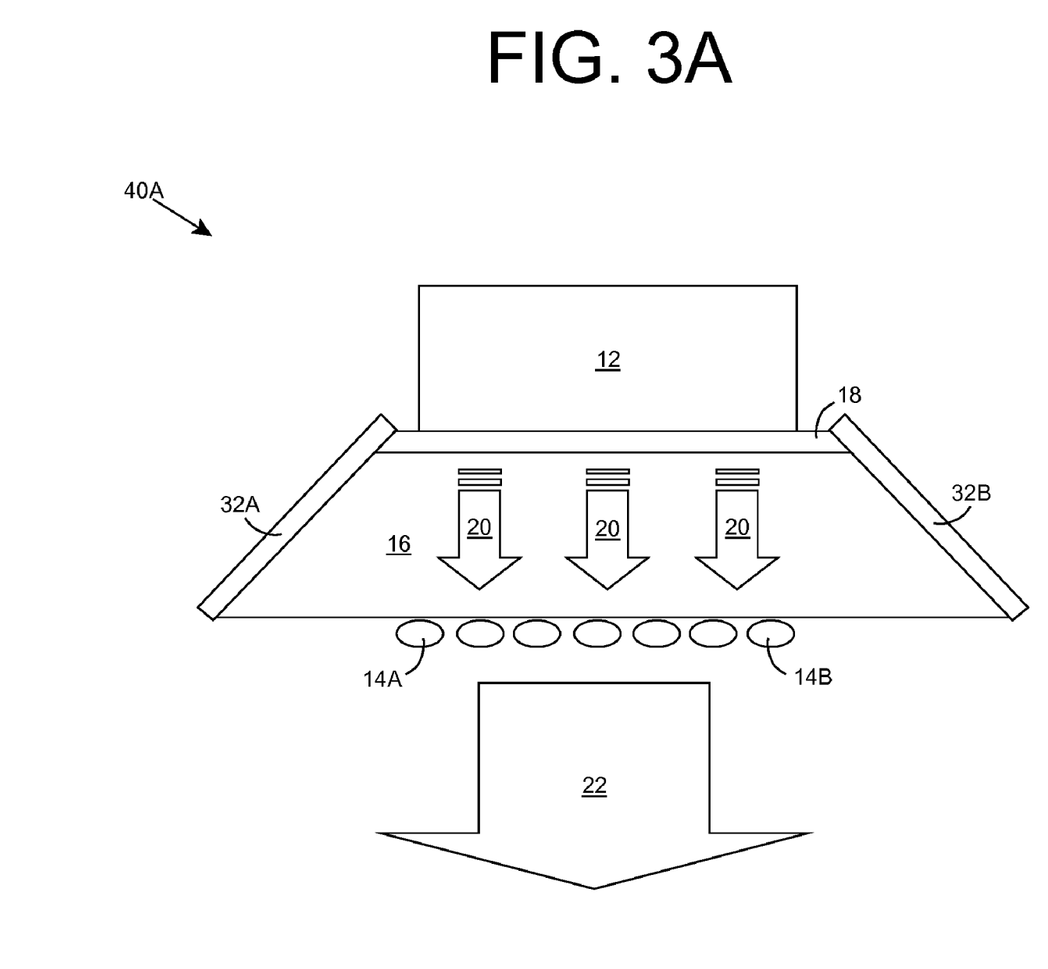
FIGS. 3A-C show illustrative devices having alternative configurations according to embodiments of the invention.
Figure 3B:
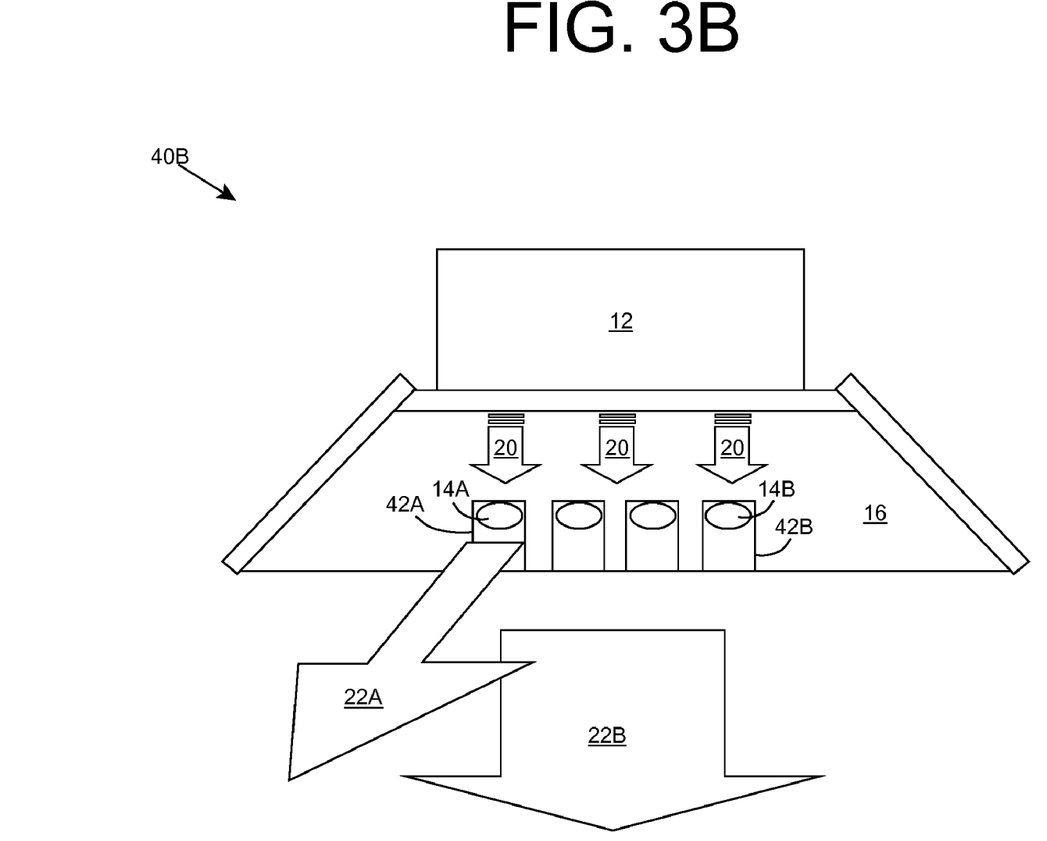
Figure 3C:
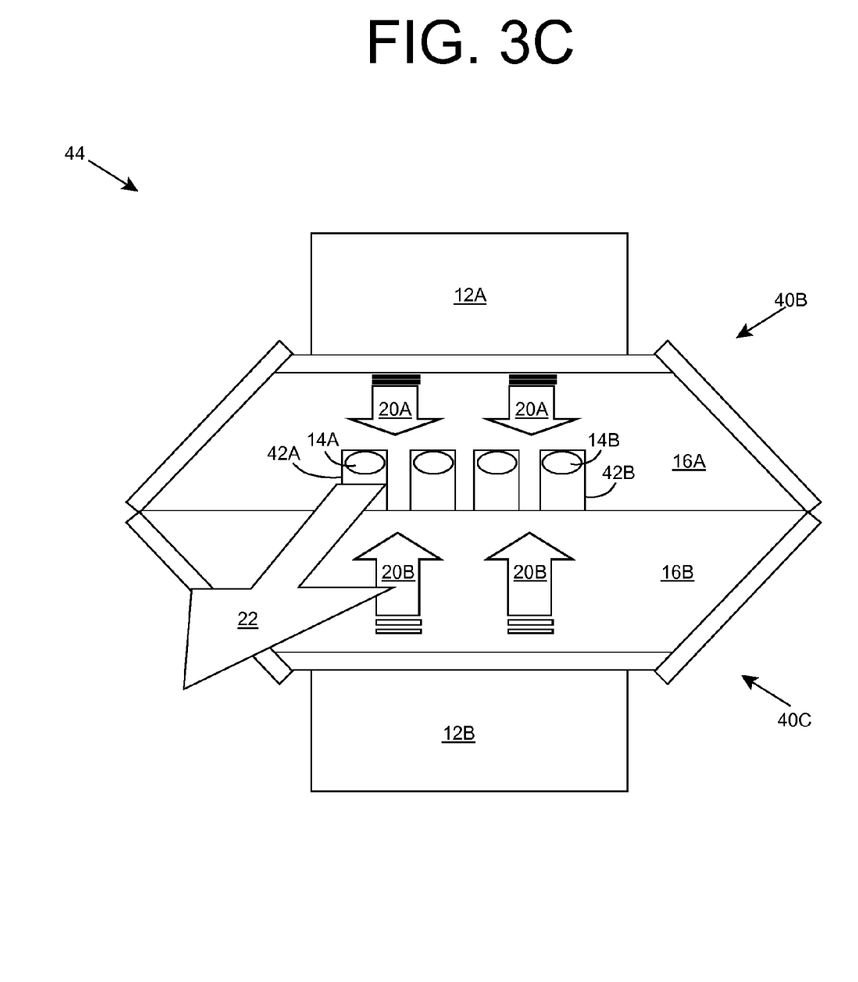

It is understood that the configurations of heterostructures 10 (FIG. 1) and 30 are only illustrative of numerous alternative configurations of heterostructures possible under various embodiments the invention. Additionally, heterostructures 10, 30, and alternative embodiments thereof, can be configured to operate as any type of laser light emitting device, chip, or the like. For example, FIGS. 3A-C show illustrative devices 40A-C having alternative configurations according to embodiments of the invention. In particular, FIG. 3A shows an illustrative device 40A that includes an LED 12 located on a transparent epitaxial structure/layer 18, which is on a transparent substrate 16. During operation, LED 12 emits pumping light 20 through epitaxial structure 18 and substrate 16 onto active media, such as active media 14A-B, which is located on an opposite side of substrate 16. In response, active media 14A-B emit laser light 22. As illustrated, device 40A can include mirrors 32A-B that assist in directing pumping light 20 onto active media 14A-B and/or directing laser light 22 out of device 40A.

FIG. 3B shows an illustrative device 40B in which active media, such as active media 14A-B, are located within a set of holes, such as holes 42A-B, in substrate 16. In this case, LED 12 emits pumping light 20 through a transparent substrate 16, and active media 14A-B can emit laser light 22B out the opposite side of device 40B and/or laser light 22A out an edge of device 40B. FIG. 3C shows an illustrative device 44 that includes device 40B and a second device 40C bonded thereto. In particular, the substrates 16A-B are bonded such that LEDs 12A-B are configured to emit pumping light 20A-B, respectively, onto active media, such as active media 14A-B, from opposite sides. In response, active media 14A-B emit laser light 22 out an edge of device 44.

Aspects of the invention enable the modulation of pumping light 20A-B and/or laser light 22. For example, pumping light 20A-B can be modulated by adjusting a duration of bias current pulses applied to one or more LEDs 12A-B, turning on/off one or more LEDs 12A-B, applying a continuous bias current, and/or the like to introduce regions with higher loss within active media 14. In this manner, one or more characteristics, such as a wavelength, direction, intensity, polarization, and/or the like, of laser light 22 emitted by active media 14 can be adjusted.

Figure 4:
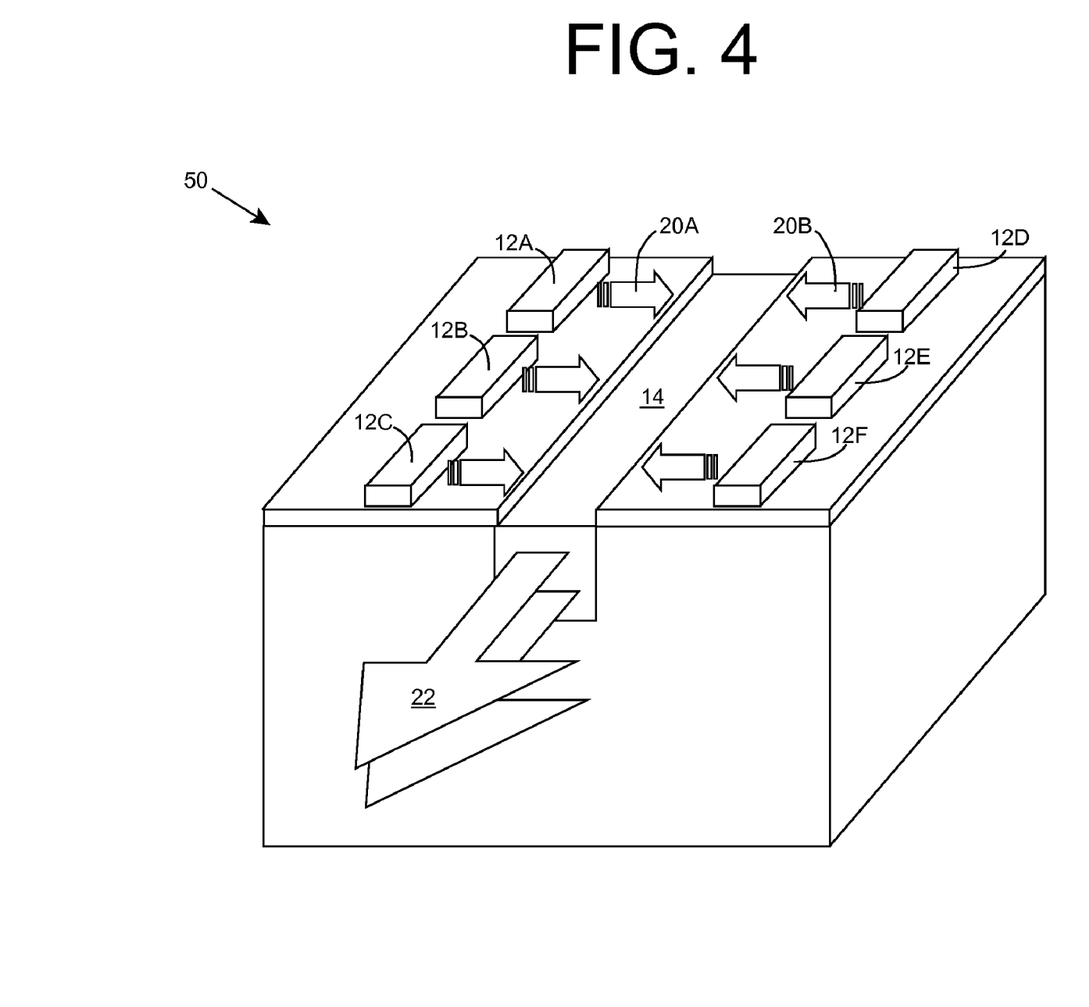
FIG. 4 shows an illustrative device that includes multiple LEDs configured to emit pumping light on a single side of active media according to an embodiment of the invention.

To this extent, FIG. 4 shows an illustrative device 50 that includes multiple LEDs 12A-F configured to emit pumping light 20A-B on a single side of active media 14 according to an embodiment of the invention. In particular, device 50 includes LEDs 12A-C that emit pumping light 20A onto a first side of active media 14 and LEDs 12D-F that emit pumping light 20B onto a second side of active media 14. In this case, pumping light 20A and/or 20B can be guided using one or more wave guiding structures and can be modulated by changing an operating characteristic and/or operating status of one or more LEDs 12A-F. To this extent, each LED 12A-F can be operated independently from other LEDs 12A-F or two or more LEDs 12A-F can be operated as a group. In an embodiment of the invention, LEDs 12A-F include multiple LEDs that emit light having varying wavelengths from one another (e.g., a mix of shorter wavelength UV LED(S) and longer wavelength UV LED(s)).

Additionally, when active media 14 comprises an inorganic laser material, active media 14 can be electrically pumped by applying an electrical current to a set of electrical contacts connected to active media 14. For example, each LED 12A-F typically includes two contacts, one to an n-type LED layer and another to a p-type LED layer. In an embodiment of the invention, the respective p-type and n-type contacts for all LEDs 12A-F are connected together to form a first contact for all n-type LED layers and a second contact for all p-type LED layers. By applying a voltage to these two contacts, active media 14 can be electrically pumped. Electrical and optical pumping can be used independently and/or in combination with one another. Further, electrical pumping can be used to adjust one or more characteristics of laser light 22. In any event, electrical and/or optical pumping can be applied to active media 14 using any combination of continuous and/or pulsed pumping modes.

Figure 5:
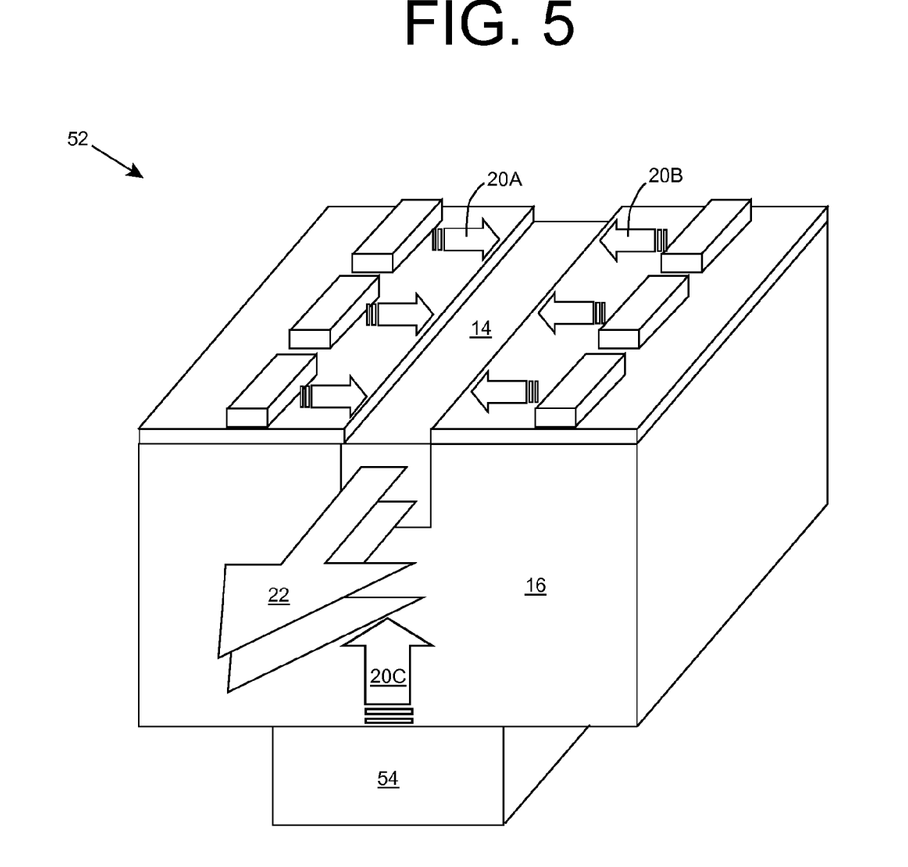
FIG. 5 shows an illustrative device that includes an LED located on a bottom side of a substrate for electrically pumping active media according to an embodiment of the invention.

Further, FIG. 5 shows an illustrative device 52 including an LED 54 located on a bottom side of substrate 16, which is configured to emit pumping light 20C through substrate 16 towards a bottom side of active medium 14 according to an embodiment of the invention. LED 54 can emit pumping light 20C simultaneously with and/or apart from pumping light 20A-B. When electrical modulation is used, pumping light 20C can provide additional activation of the p-doping in one or more p-type layers of active medium 14 (e.g., by increasing the hole concentration of the p-doped layer in the laser light generating structure).

Figure 6A:
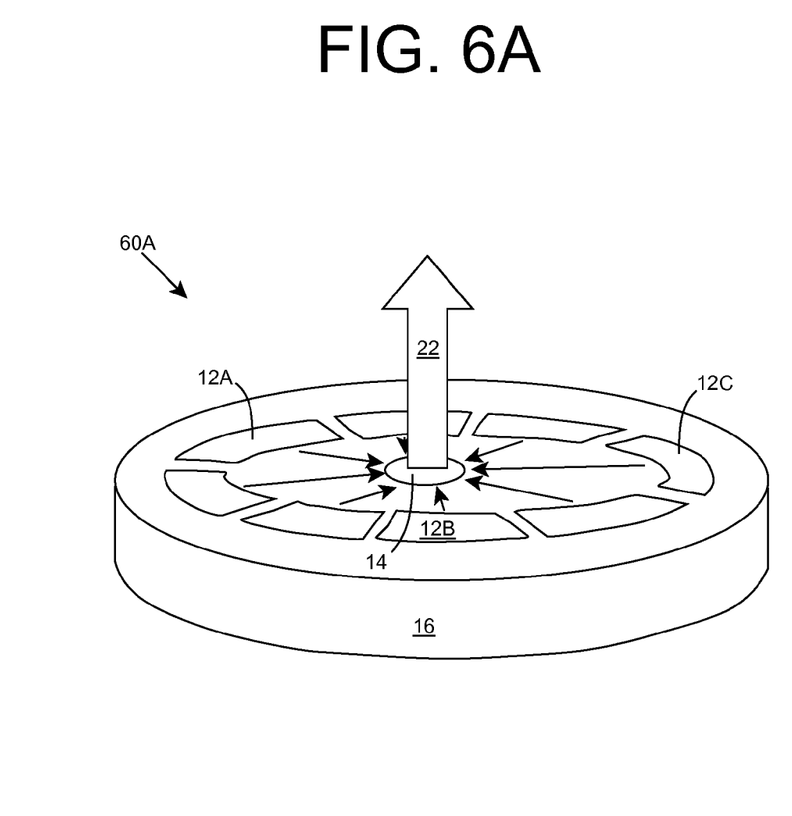
FIGS. 6A-B show illustrative devices each having a circular arrangement of pumping LEDs about an active medium according to embodiments of the invention.
Figure 6B:
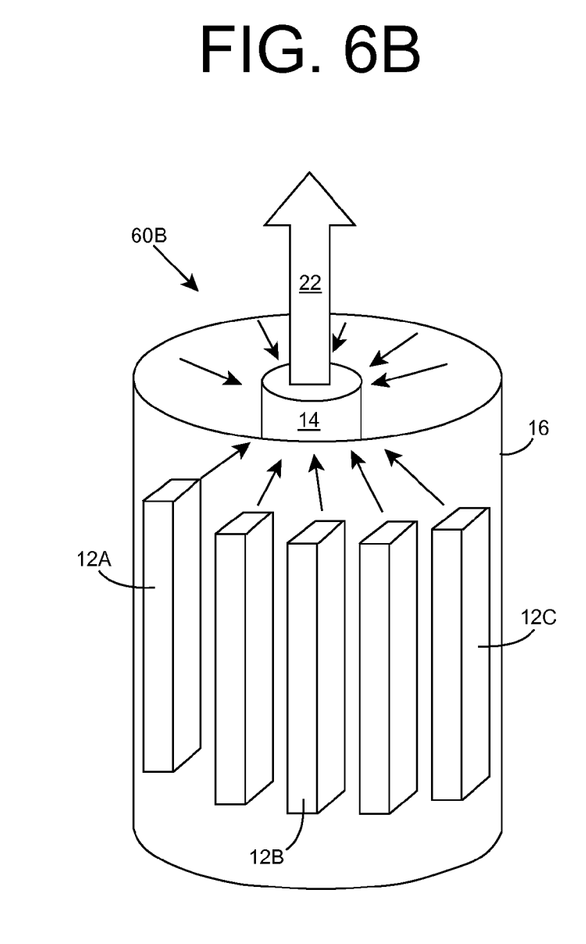

It is understood that the set of pumping LED(s) can be located in any pattern to emit pumping light onto active medium 14. The LED(s) can be located with respect to active medium 14 based on a desired shape of the device, a shape/size of active medium 14, and/or the like. To this extent, FIGS. 6A-B show illustrative devices 60A-B each having a substantially circular arrangement of pumping LEDs, such as LEDs 12A-C, about active medium 14 according to embodiments of the invention. As illustrated, devices 60A-B can include a substantially cylindrical active medium 14, and LEDs 12A-C can emit pumping light directed towards active medium 14 from numerous points around active medium 14, which in turn can emit laser light 22.

In device 60A, LEDs 12A-C and active medium 14 can be located on substrate 16 and wave guiding structures or the like in substrate 16 can direct the pumping light toward active medium 14. In an embodiment of the invention, substrate 16 comprises a flexible substrate, such as a thinned sapphire substrate. To this extent, device 60B can include LEDs 12A-C located on a flexible substrate 16, which is bent to form a cylindrical lens to focus light emitted by LEDs 12A-C on active medium 14, which is located on along an axis of the cylindrical lens.

FIGS. 7A-D show illustrative devices 70A-D that use a flexible substrate according to embodiments of the invention. For example, in FIG. 7A, device 70A includes a flexible substrate 16A on which a set of LEDs 12 are located and a transparent substrate 16B on which an active medium 14 is located. Flexible substrate 16A is connected (e.g., glued) to transparent substrate 16B and forms a substantially arc-shape (e.g., a half cylindrical surface) having active medium 14 at a focal point. In this configuration, LEDs 12 can emit pumping light onto active medium 14, which in turn can emit laser light 22 through transparent substrate 16B.

Figure 7A:
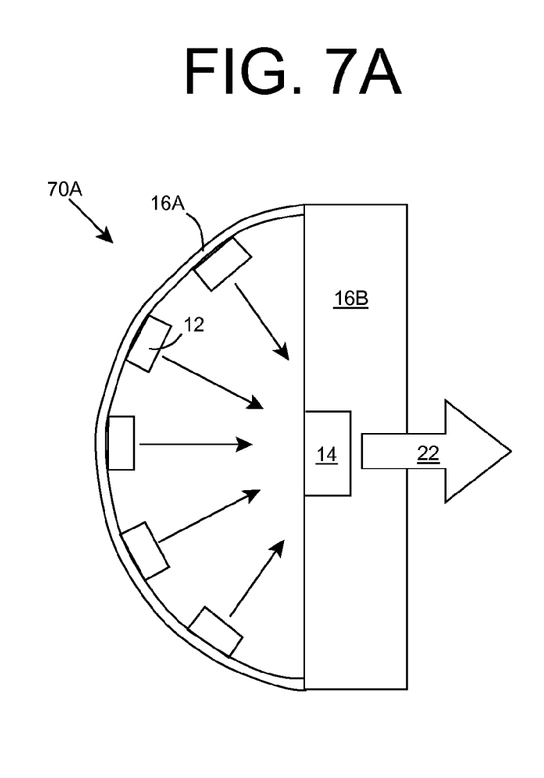
FIGS. 7A-D show illustrative devices that use a flexible substrate according to embodiments of the invention.
Figure 7B:
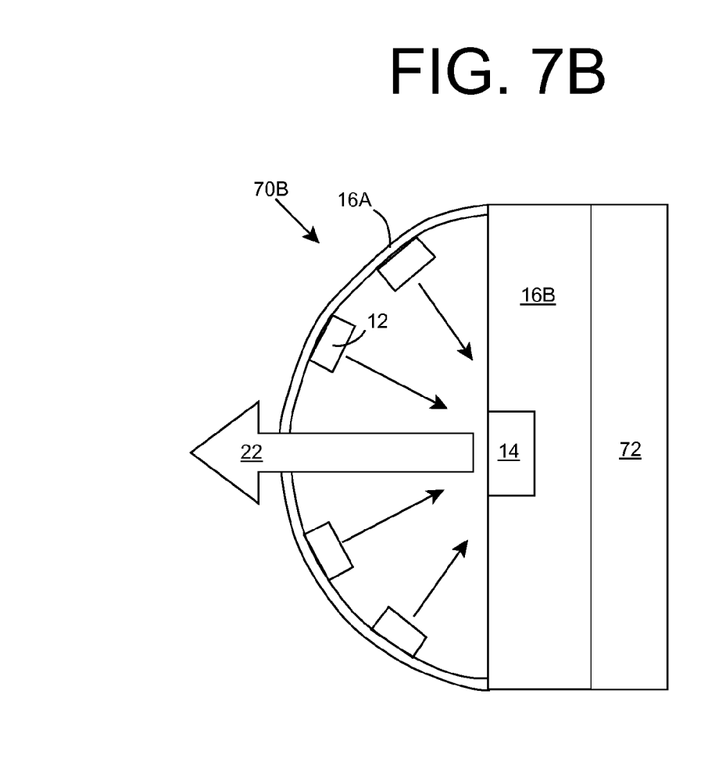
Figure 7C:
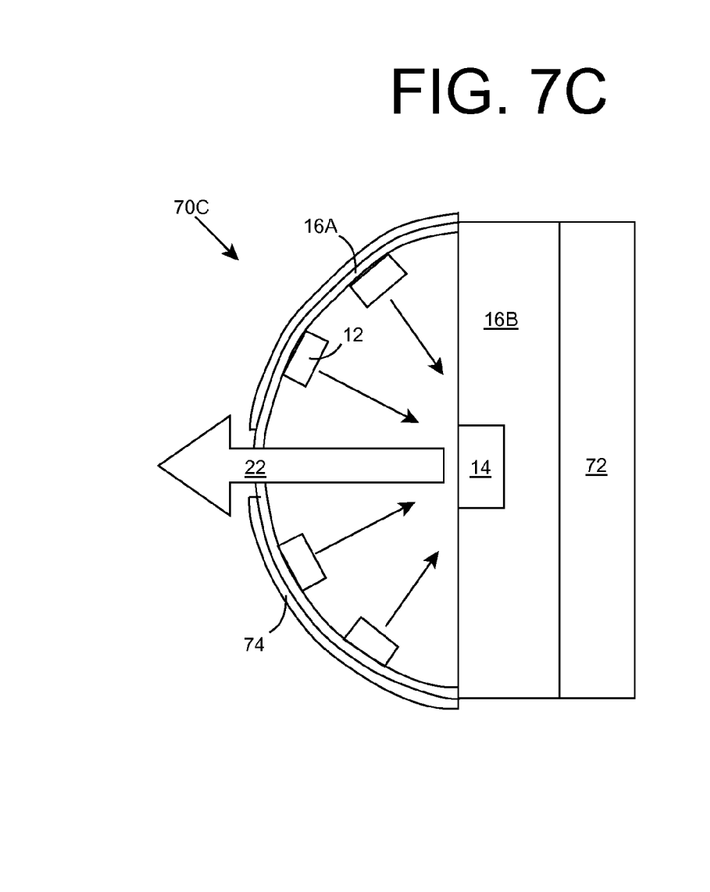

One or more reflective surfaces also can be incorporated into device 70A. For example, in FIG. 7B, device 70B is shown having a similar configuration as device 70A (FIG. 7A). However, in device 70B, substrate 16A also can comprise a transparent substrate, and a reflective structure 72, such as DBR structure, is located on the opposite side of substrate 16B. In this configuration, laser light 22 generated by active medium 14 can be emitted from device 70B through flexible substrate 16A. Similarly, in FIG. 7C, device 70C also includes a second reflective structure 74, such as a metal layer or the like, located on an outer surface of flexible substrate 16A. Reflective structure 74 can enhance the optical pumping of active medium 14 by reflecting and/or guiding the pumping light emitted by LEDs 12, and can include an opening through which laser light 22 can be emitted from device 70C.

Figure 7D:
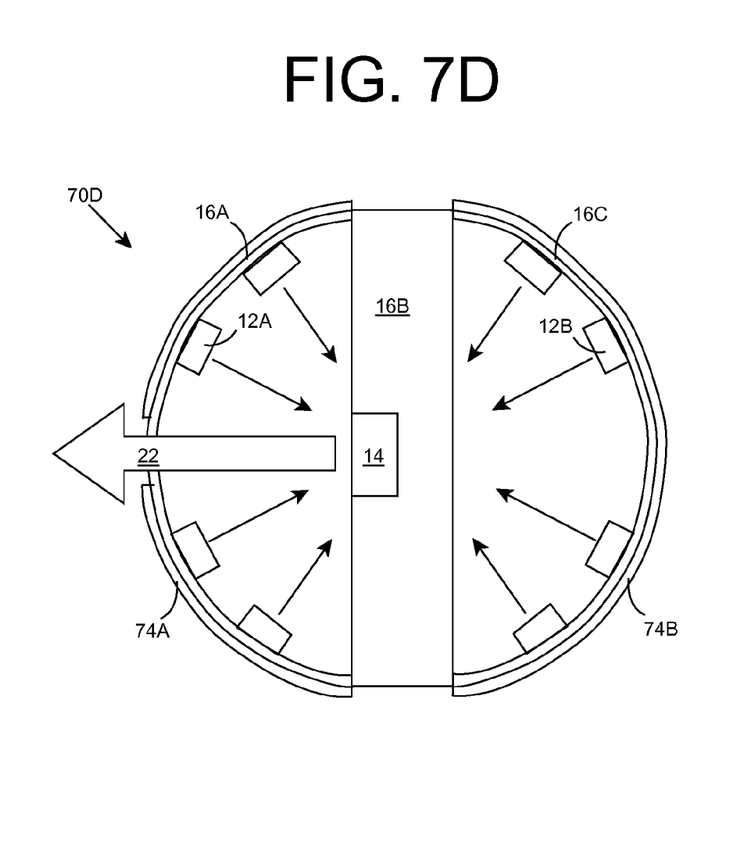

Further, in FIG. 7D, device 70D includes a second flexible substrate 16C attached to substrate 16B in a substantially arc-shape on an opposite side of substrate 16B from substrate 16A. Substrate 16C includes a second set of LEDs 12B that can emit pumping light toward active medium 14. Additionally, a second reflective structure 74B is shown located on an outer surface of substrate 16C. In this configuration, LEDs 12A-B can emit pumping light toward active medium 14 from several locations on a substantially circular perimeter about active medium 14. Reflective structures 74A-B can enhance the optical pumping by providing reflective surfaces for the emitted pumping light.

While shown and described herein with respect to various heterostructure/device configurations, aspects of the invention also provide a method of manufacturing a laser light generating device. To this extent, referring to FIG. 1, the method can include obtaining a substrate 16 and applying an active medium 14 (e.g., a laser light generating structure) on substrate 16 using any solution. For example, a trench 19 can be initially applied in substrate 16 using any solution, and active medium 14 can be deposited therein. Additionally, active media can be applied to a surface of substrate 16 (e.g., as shown in FIG. 3A), to one or more holes in substrate 16 (e.g., as shown in FIG. 3B), and/or the like, using any solution.

The method can further include applying a set of LEDs on substrate 16. The set of LED(s) can be applied to the same side of substrate 16 (e.g., as shown in FIG. 1) and/or to the opposite side of substrate 16 (e.g., as shown in FIGS. 3A and 5) as active medium 14 using any solution. For example, an epitaxial structure (including one or more epitaxial layers) can be applied on substrate 16 using any solution, and LED(s) 12A-B can be applied directly on epitaxial structure 18 using any solution. LED(s) 12A-B can be applied on substrate 16 before and/or after active medium 14 is applied thereon. Further, the method can include attaching two or more substrates using any solution. For example, as shown in FIG. 7A, active medium 14 can be applied to a first substrate 16B using any solution, and a set of LEDs 12 can be applied to a second substrate 16A using any solution. Substrates 16A-B can be attached in a manner that enables the set of LEDs 12 to emit pumping light onto active medium 14.

The growth of active medium(ia) 14 and/or LED(s) 12 can utilize various growth techniques to obtain particular operating capabilities. For example, in an embodiment of the invention, growth of one or more quantum wells in an LED and/or the active medium ensures that it is sufficiently narrow to ensure that an electronic ground state in the quantum well(s) has a higher energy than a highest energy of the bottom of the conduction band in the quantum well(s). Additionally, in an embodiment of the invention, an active region in an LED and/or the active medium includes non-uniform clustering of Aluminum in one or more AlGaN layers, which can provide improved light emission due to additional carrier confinement and carrier separation from nonradiative centers. Still further, in an embodiment of the invention, one or more layers in an LED and/or the active medium can be grown on Epitaxial Lateral Overgrowth high quality/low defect density materials. These techniques are shown and described in the co-owned, co-pending U.S. patent application Ser. No. 11/292,519, entitled "Nitride-Based Light Emitting Heterostructure", which is incorporated herein by reference, and/or in the co-owned, co-pending U.S. patent application Ser. No. 11/539,754, entitled "Heterostructure Including Light Generating Structure Contained in Potential Well", which is incorporated herein by reference.

It is understood that additional processing can be performed to generate a heterostructure/device according to the invention. For example, one or more reflective structures may be applied to a surface of a substrate. Similarly, when a flexible substrate is used, the substrate can be formed into a shape that enables the optical pumping of an active medium by a set of LEDs. Additionally, one or more electrical contacts, and/or electrical paths can be formed within the heterostructure/device to enable the operation of each LED and/or the electrical pumping of the active medium.

Additional aspects of the invention provide a method of generating laser light. For example, an aspect of the invention generates laser light using one of the illustrative heterostructures/devices (hereafter device) shown and/or described herein. In particular, LED(s) in the device emit light that optically pumps laser light generating structure(s) (e.g., an active medium) in the device. The optical pumping can be implemented using pulsed light emitted from one or more LEDs and/or using continuous light emitted from one or more LEDs. To this extent, a circuit in which the device is operating can provide a pulsed and/or continuous electrical current to each LED using any solution.

Additionally, when the laser light generating structure comprises an inorganic laser light generating material, the circuit also can electrically pump the laser light generating structure. For example, the circuit can provide an electrical current to one or more contacts connected to the active medium. Similar to the optical pumping, the electrical pumping also can be continuous or pulsed. To this extent, the electrical and/or optical pumping can be performed alone or using any combination of pulsed and/or continuous operations.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A laser light generating heterostructure comprising:
    a substrate comprising anodized aluminum and including a plurality of holes;
    a laser light generating structure comprising laser material located within at least some of the plurality of holes; and a set of light emitting diodes located on the substrate, the set of light emitting diodes being configured to optically pump the laser light generating structure using an array of holes in the plurality of holes forming a photonic crystal.

2. The heterostructure of claim 1, the laser light generating structure comprising an organic laser material.

3. The heterostructure of claim 1, the laser light generating structure comprising an inorganic laser material.

4. The heterostructure of claim 3, the laser light generating structure comprising at least one of: a multiple quantum well laser structure, a quantum wire laser structure, or a quantum dot laser structure.

5. The heterostructure of claim 1, further comprising an epitaxial layer directly on the substrate, the set of light emitting diodes being directly on the epitaxial layer.

6. The heterostructure of claim 1, the set of light emitting diodes including a group-III nitride-based light emitting diode.

7. The heterostructure of claim 1, the set of light emitting diodes including alight emitting diode that emits ultraviolet light.

8. The heterostructure of claim 1, further comprising a reflective surface configured to reflect at least one of: light emitted from a light emitting diode toward the laser light generating structure or laser light generated by the laser light generating structure out of the heterostructure.

9. The heterostructure of claim 8, the reflective surface comprising a distributed Bragg reflector structure.

10. A laser light generating device comprising:
a flexible substrate comprising a material having a thickness that enables the substrate to be bent;
a laser light generating structure;
a plurality of light emitting diodes located on an inner surface of the flexible substrate, wherein the flexible structure is bent to locate the plurality of light emitting diodes to optically pump the laser light generating structure from a plurality of fixed points around the laser light generating structure and direct light emitted from the plurality of light emitting diodes towards the light generating structure, and wherein the substrate is substantially transparent with respect to the laser light generated by the laser light generating structure and the light emitted by the set of light emitting diodes; and
a first reflective surface located on an outer surface of the flexible substrate, wherein the first reflective surface is configured to reflect at least one of: the light emitted by the set of light emitting diodes toward the laser light generating structure or the laser light generated by the laser light generating structure out of the device.

11. The device of claim 10, the substrate having a substantially arc-shape.

12. The device of claim 10, further comprising a set of electrical contacts connected to the laser light generating structure, the laser light generating structure comprising an inorganic laser material.

13. The device of claim 10, further comprising an epitaxial layer directly on the substrate, the set of light emitting diodes being directly on the epitaxial layer.

14. The device of claim 10, further comprising a transparent substrate physically connected to opposing ends of the flexible substrate, the laser light generating structure being located on the transparent substrate and configured to emit the laser light through the transparent substrate.

15. A method of generating laser light, the method comprising:

obtaining a laser light generating device including:
a substrate comprising anodized aluminum and including a plurality of holes;
a laser light generating structure comprising laser material located within at least some of the plurality of holes;
an array of holes in the plurality of holes forming a photonic crystal; and
a set of light emitting diodes located on the substrate; and
optically pumping the laser light generating structure with light emitted from the set of light emitting diodes using the array of holes.

16. The method of claim 15, the optically pumping including providing pulsed light from a light emitting diode.

17. The method of claim 15, the optically pumping including providing continuous light from a light emitting diode.

18. The method of claim 15, further comprising electrically pumping the laser light generating structure, the laser light generating structure comprising an inorganic laser material.

19. The method of claim 18, the electrically pumping including providing a pulsed electrical current to the laser light generating structure.

20. The method of claim 18, the electrically pumping including providing a continuous electrical current to the laser light generating structure.

21. The heterostructure of claim 1, wherein the set of light emitting diodes are located at a plurality of points around the laser light generating structure.

22. The heterostructure of claim 1, wherein the set of light emitting diodes includes a first subset of light emitting diodes configured to emit ultraviolet radiation having a first wavelength and a second subset of light emitting diodes configured to emit ultraviolet radiation having a second wavelength distinct from the first wavelength.

23. The device of claim 10, wherein the plurality of light emitting diodes includes a first set of light emitting diodes and a second set of light emitting diodes configured to operate independently of the first set of light emitting diodes.

24. The device of claim 10, wherein opposing ends of the flexible substrate are physically attached to form a cylindrical lens, and wherein the laser light generating structure comprises an elongate structure located along an axis of the cylindrical lens.

25. The device of claim 10, further comprising:
a transparent substrate physically connected to opposing ends of the flexible substrate, the laser light generating structure being located on the transparent substrate;
a second flexible substrate having opposing ends physically connected to an opposing side of the transparent substrate as the flexible substrate; and
a second plurality of light emitting diodes located on an inner surface of the second flexible substrate, the plurality of light emitting diodes being configured to optically pump the laser light generating structure from a plurality of points around the laser light generating structure, wherein the second flexible substrate is bent to direct light emitted from the second plurality of light emitting diodes towards the light generating structure.

26. The device of claim 25, further comprising a second reflective surface located on an outer surface of the second flexible substrate, the second reflective surface being configured to reflect at least one of: the light emitted from the second plurality of light emitting diodes toward the laser light generating structure or the laser light generated by the laser light generating structure out of the device, and the first reflective surface including an opening configured to enable the laser light to leave the device.

27. The device of claim 10, wherein the first reflective surface includes an opening configured to enable the laser light to leave the device.

28. The device of claim 27, further comprising:
    a transparent substrate physically connected to opposing ends of the flexible substrate, the laser light generating structure being located on the transparent substrate; and
    a reflective structure located adjacent to the transparent substrate on an opposing side of the flexible substrate, wherein the reflective structure is configured to reflect at least one of: the light emitted from the plurality of light emitting diodes toward the laser light generating structure or the laser light generated by the laser light generating structure out of the device.

29. A method of generating laser light, the method comprising:
    obtaining a laser light generating device including:
        a flexible substrate comprising a material having a thickness that enables the substrate to be bent;
        a laser light generating structure;
        a plurality of light emitting diodes located on an inner surface of the flexible substrate, wherein the flexible structure is bent to locate the plurality of light emitting diodes to optically pump the laser light generating structure from a plurality of fixed points around the laser light generating structure and direct light emitted from the plurality of light emitting diodes towards the light generating structure, and wherein the substrate is substantially transparent with respect to the laser light generated by the laser light generating structure and the light emitted by the set of light emitting diodes; and
        a first reflective surface located on an outer surface of the flexible substrate, wherein the first reflective surface is configured to reflect at least one of: the light emitted by the set of light emitting diodes toward the laser light generating structure or the laser light generated by the laser light generating structure out of the device; and
    optically pumping the laser light generating structure with light emitted from the plurality of light emitting diodes.

30. The method of claim 29, wherein the optically pumping includes operating a first set of light emitting diodes in the plurality of light emitting diodes independently from operating a second set of light emitting diodes in the plurality of light emitting diodes.

31. The method of claim 29, further comprising electrically pumping the laser light generating structure, the laser light generating structure comprising an inorganic laser material.

\* \* \* \* \*